(12) United States Patent
Chrysler et al.

(10) Patent No.: US 7,435,623 B2
(45) Date of Patent: Oct. 14, 2008

(54) INTEGRATED MICRO CHANNELS AND MANIFOLD/PLENUM USING SEPARATE SILICON OR LOW-COST POLYCRYSTALLINE SILICON

(75) Inventors: Gregory M. Chrysler, Chandler, AZ (US); Ravi Prasher, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 143 days.

(21) Appl. No.: 11/284,538

(22) Filed: Nov. 22, 2005

(65) Prior Publication Data

US 2006/0071326 A1    Apr. 6, 2006

Related U.S. Application Data

(62) Division of application No. 10/749,901, filed on Dec. 29, 2003, now Pat. No. 6,992,382.

(51) Int. Cl.
*H01L 21/00* (2006.01)
(52) U.S. Cl. .................. 438/122; 257/E21.499
(58) Field of Classification Search .......... 257/712, 257/714, 719, 722; 438/122, E21.499
See application file for complete search history.

(56) References Cited

U.S. PATENT DOCUMENTS

| | | | |
|---|---|---|---|
| 4,226,281 A | 10/1980 | Chu | |
| 4,450,472 A | 5/1984 | Tuckerman et al. | |
| 4,774,630 A | 9/1988 | Reisman et al. | |
| 4,996,589 A | 2/1991 | Kajiwara et al. | |
| 5,125,451 A | 6/1992 | Matthews | |
| 5,232,047 A | 8/1993 | Matthews | |
| 5,239,200 A | 8/1993 | Messina et al. | |
| 5,263,251 A | 11/1993 | Matthews | |
| 5,420,753 A | 5/1995 | Akamatsu et al. | |
| 5,959,352 A | 9/1999 | Topfer et al. | |
| 6,351,384 B1 * | 2/2002 | Daikoku et al. | ............. 361/704 |
| 6,903,929 B2 * | 6/2005 | Prasher et al. | ............. 361/699 |
| 2005/0151244 A1 | 7/2005 | Chrysler et al. | |

FOREIGN PATENT DOCUMENTS

JP    2002-076210    3/2002

OTHER PUBLICATIONS

Harper, C. A., "Electronic Packaging and Interconnection Handbook", *McGraw-Hill, Inc.*, (1991), 1.58-1.59, 1.62-1.65.
Tuckerman, D., "Heat-Transfer Microstructures for Integrated Circuits", *Stanford University*, pp. 1-141, 1984., (Feb. 1984), 1-141.
Tuckerman, D. B., et al., "High-Performance Heat Sinking for VLSI", *IEEE Electron Device Letters*, vol. EDL-2, No. 5 (May 1981), 126-129.

* cited by examiner

*Primary Examiner*—David A Zarneke
(74) *Attorney, Agent, or Firm*—Schwegman, Lundberg & Woessner, P.A.

(57) ABSTRACT

A method and apparatus for cooling an electronics chip with a cooling plate having integrated micro channels and manifold/plenum made in separate single-crystal silicon or low-cost polycrystalline silicon. Forming the microchannels in the cooling plate is more economical than forming the microchannels directly into the back of the chip being cooled. In some embodiments, the microchannels are high-aspect-ratio grooves formed (e.g., by etching) into a polycrystalline silicon cooling base, which is then attached to a cover (to contain the cooling fluid in the grooves) and to the back of the chip.

4 Claims, 3 Drawing Sheets

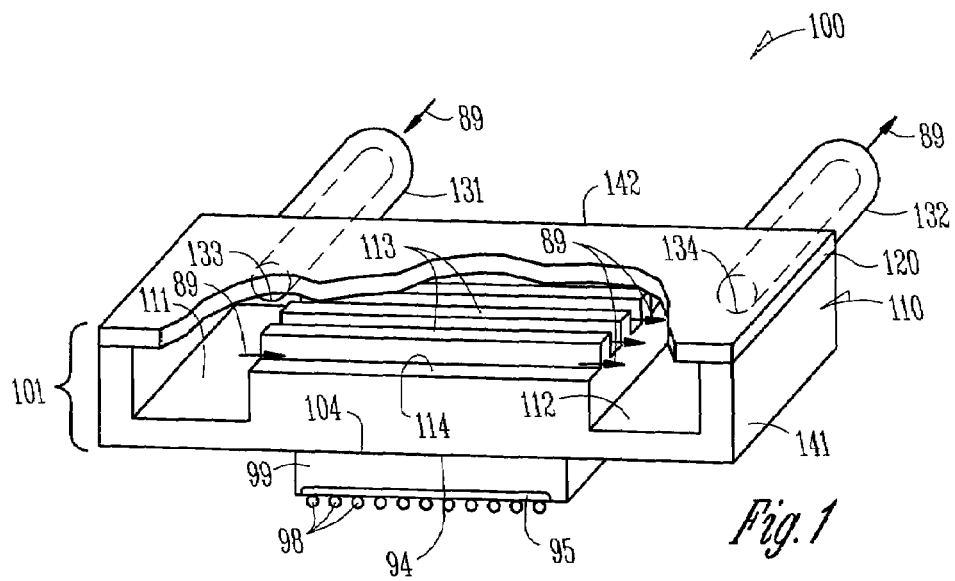
Fig. 1
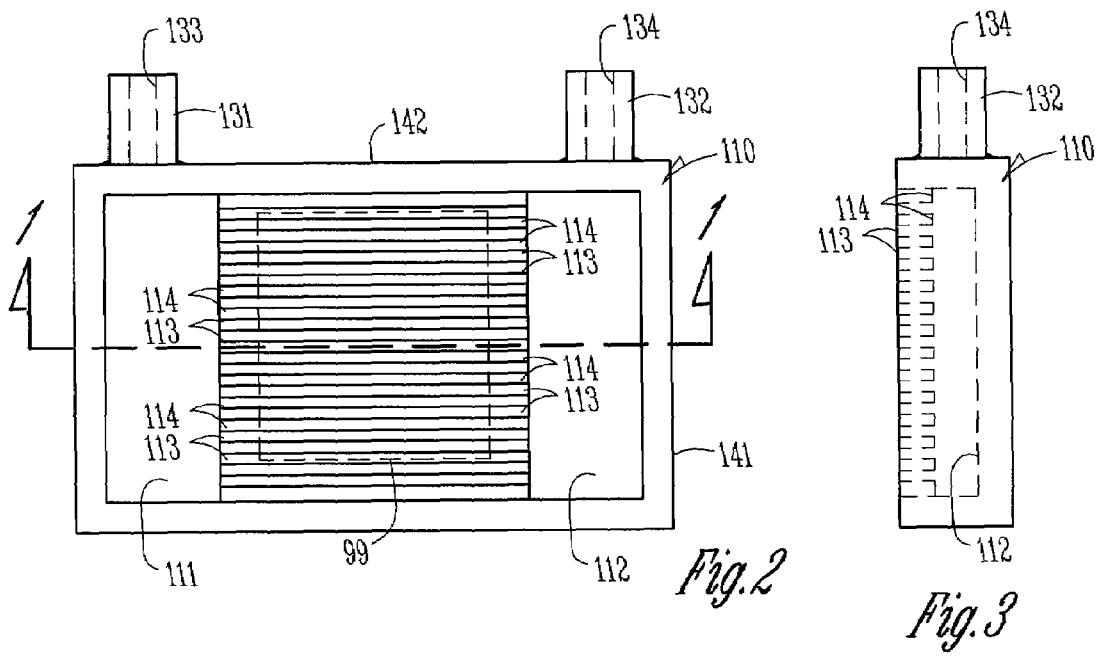
Fig. 2
Fig. 3
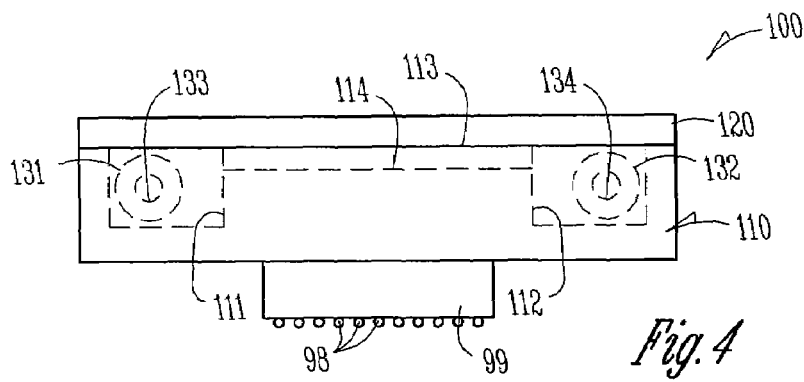
Fig. 4

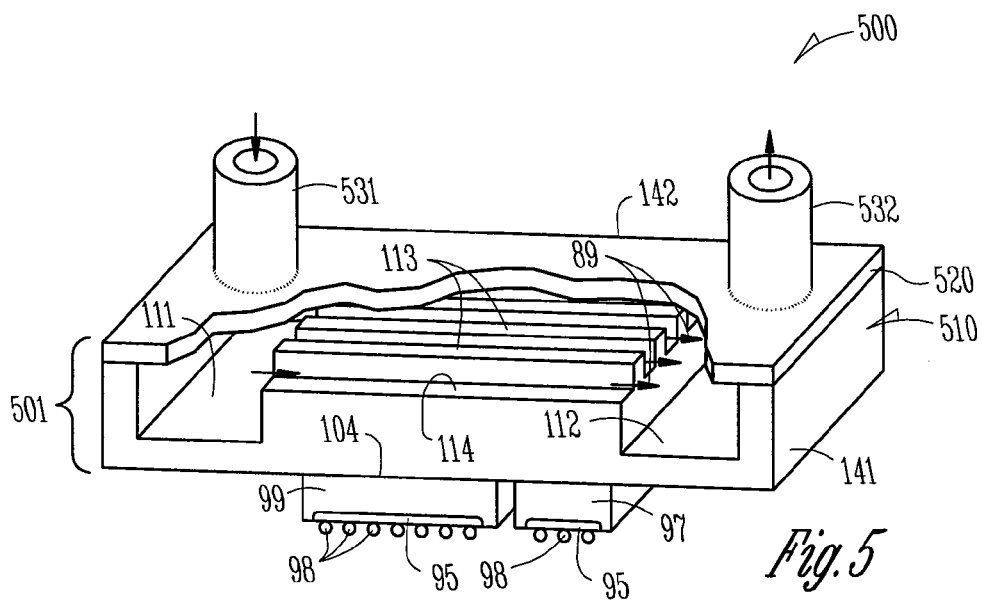
Fig. 5
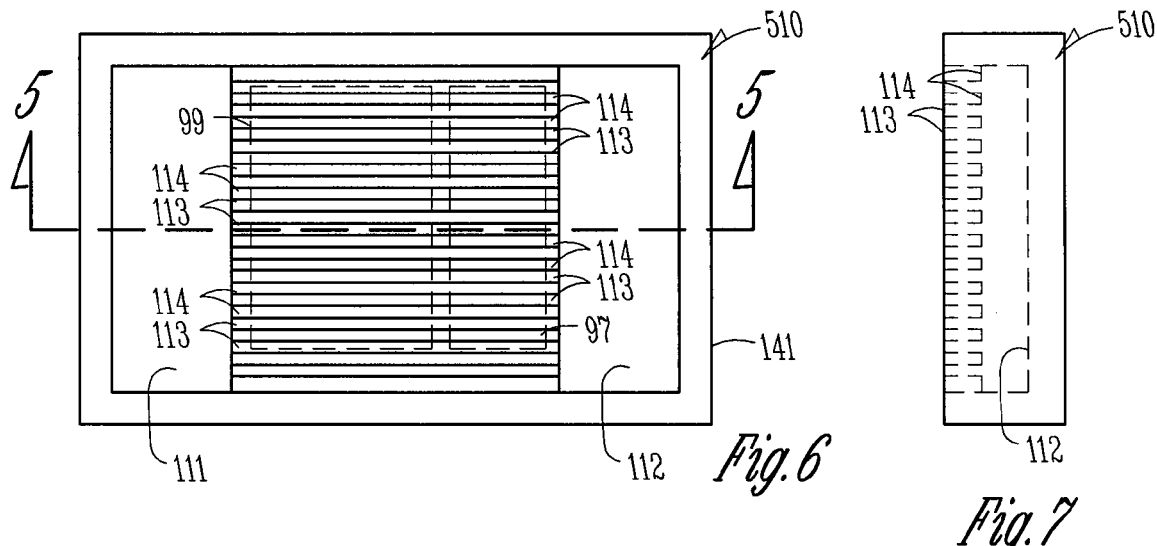
Fig. 6
Fig. 7
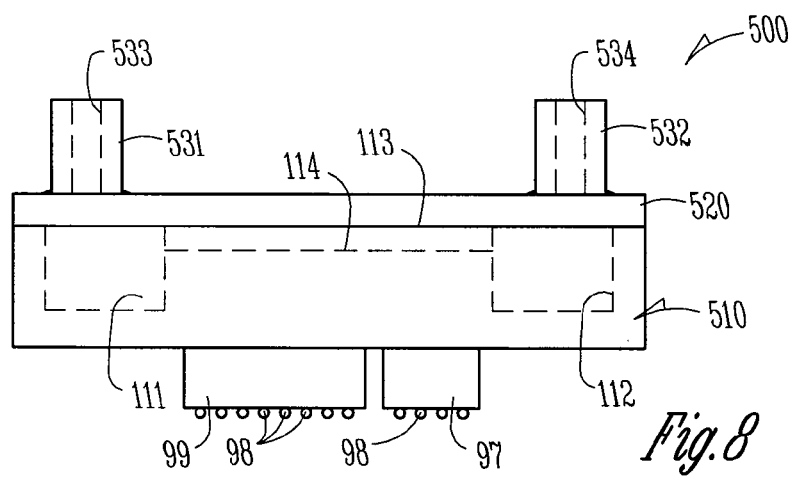
Fig. 8

US 7,435,623 B2

INTEGRATED MICRO CHANNELS AND MANIFOLD/PLENUM USING SEPARATE SILICON OR LOW-COST POLYCRYSTALLINE SILICON

RELATED APPLICATION(S)

This application is a divisional of U.S. application Ser. No. 10/749,901 filed on Dec. 29, 2003 now U.S. Pat. No. 6,992,382 which is incorporated herein by reference.

BACKGROUND

Bare electronic chips typically need to be packaged in a package that provides an electric circuit between each electrical connection of the chip and an external connector such as a pin or a ball extending from the package to external circuitry such as a printed-circuit board. The circuitry on the chip, particularly a very fast chip such as a microprocessor, generates a considerable amount of heat. Typically, the circuitry and electrical connections for a chip are provided on one face of the chip. Sometimes, the majority of heat is removed from the opposite face of the chip.

The circuit side of the chip typically provides pads that are connected to the chip's packaging using, for example, solder-ball connections, which provide connections for electrical power and for input-output signals. The opposite, or back, side of the chip can have a heatsink or other heat-removing device attached, providing heat elimination using passive cooling systems A package typically has a non-conductive substrate (such as a plastic film or layer, or a ceramic layer) with conductive traces (wires) on or in a surface of the substrate. Either solder-ball connections or wirebond connects a chip to the package. Some packages include multiple chips, such as one or more logic or processor chips, one or more communications chips (such as for a cell phone or wireless local-area network (LAN)), and/or one or more memory chips, such as a FLASH-type reprogrammable non-volatile memory. Optionally, a cover or encapsulant is used to enclose parts or all of the chip or chips.

BRIEF DESCRIPTION OF THE DRAWINGS

FIG. 1 is a perspective cut-away schematic view of a chip package 100.

FIG. 2 is a top schematic view of a cooling-plate base 110.

FIG. 3 is an end schematic view of a cooling-plate base 110.

FIG. 4 is a side schematic view of a chip package 100.

FIG. 5 is a perspective cut-away schematic view of a chip package 500.

FIG. 6 is a top schematic view of a cooling-plate base 510.

FIG. 7 is an end schematic view of a cooling-plate base 510.

FIG. 8 is a side schematic view of a chip package 500.

DESCRIPTION OF PREFERRED EMBODIMENTS

Figure 9:
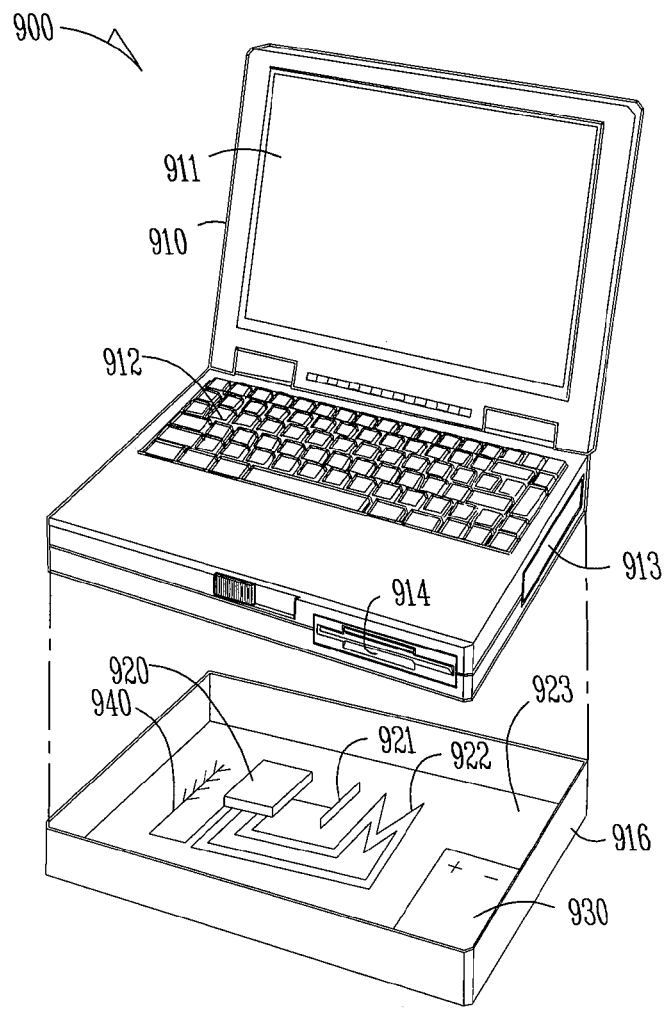
FIG. 9 is a perspective schematic view of an electronics system having a chip package and a silicon cooling plate.

In the following detailed description of the preferred embodiments, reference is made to the accompanying drawings that form a part hereof, and in which are shown by way of illustration specific embodiments in which some embodiments of the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon (i.e., polycrystalline silicon), doped single-crystal silicon (often referred to simply as diffusion, regardless of whether such doping is achieved by thermal diffusion or ion implantation), titanium (Ti), molybdenum (Mo), and refractory metal silicides are examples of other conductors.

In this description, the term metal applies both to substantially pure single-metallic elements and to alloys or combinations of two or more elements, at least one of which is a metallic element.

The terms substrate or core generally refer to the physical structure or layer that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting materials, or combinations of semiconducting and non-semiconducting materials. In some embodiments, substrates include layered structures, such as a core sheet or piece of material (such as iron-nickel alloy) chosen for its coefficient of thermal expansion (CTE) that more closely matches the CTE of an adjacent structure such as a silicon processor chip. In some embodiments, such a substrate core is laminated to a sheet of material chosen for electrical and/or thermal conductivity (such as a copper or aluminum alloy), which in turn is covered with a layer of plastic chosen for electrical insulation, stability, and embossing characteristics. In some embodiments, the plastic layer has wiring traces that carry signals and electrical power horizontally, and vias that carry signals and electrical power vertically between layers of traces.

The term vertical is defined to mean substantially perpendicular to a major surface of a substrate. Height or depth refers to a distance in a direction perpendicular to the major surface of a substrate.

Some embodiments provide a micro-channel cooling-plate approach for silicon semiconductors with an integrated manifold and plenum utilizing silicon or low-cost polycrystalline silicon. The microchannels are formed by etching or otherwise forming numerous parallel deep grooves (i.e., trenches having a high aspect ratio), formed between narrow walls, and through which water or other cooling fluid (i.e., a liquid and/or gas) is pumped. The microchannels, in some embodiments having an aspect ratio of 2:1, 3:1, or up to 6:1 or more, greatly increase the surface area of the silicon exposed to the cooling fluid, thus enhancing heat transfer. In some embodiments, the cooling plate is made of silicon to match the coefficient of thermal expansion (CTE) of the silicon chip being cooled. (In other embodiments, when the chip to be cooled is not silicon, then the cooling plate would be made of a material identical to, or matching the CTE of the chip to be cooled).

In some embodiments, the cooling plate is made separately from the chip, allowing the cooling plate to be much larger than the chip, and separating yield problems involved with the plate manufacture from those of the chip manufacture. Thus, one company with expertise in chip manufacture can make the chip independently from another company with expertise in silicon cold-plate manufacture, and then when each is substantially complete, the chip and the silicon cold plate are joined.

In some embodiments, low-cost microchannels cooling (single-phase—liquid only or gas only; or boiling—using both liquid and gas phases) are provided for high-power and high-power-density processors. In some embodiments, performance in several areas is improved: CTE mismatch between the die and the coldplate, the potential fabrication-yield problems associated with creating cooling channels in the back side of the die, and the high cost of using single-crystal silicon to circumvent the mismatch in CTE between the die and the cooling structure.

Some embodiments use cooling approaches that have either single-crystal silicon to match the CTE, or process the die itself to create cooling channels, but these face the problem of high cost when extra length and/or width is desired for providing a means of securing liquid lines and for fabricating the manifold to the coldplate, and/or when yield is considered.

Some embodiments place the microchannels and the manifold/plenum in a single integrated package creating the coldplate. Since a separate wafer of single-crystal or low-cost polycrystalline silicon can be used, the over-sized plate (compared to the die) is not a serious cost issue, nor is the potential fabrication-yield reductions associated with back-side processing of the silicon die itself. The manifold providing liquid coolant to the multiple channels and the plenum collecting the fluid after cooling the die can be made from a single-crystal or polycrystalline silicon part separately from the silicon chip to be cooled. The bonding of the coldplate to the silicon chip can be done by various methods such as thermal bonding, high-thermal-conductivity solder bonding, gold bonding, or other wafer-to-wafer bonding techniques. These bonding techniques do not result in interface thermal resistance. Thermal conductivity of polycrystalline silicon is approximately the same as single-crystal silicon, which will keep the thermal performance substantially the same as using the single-crystal silicon.

Forced-convection heat transfer in mini- or microchannels results in a very high heat-transfer coefficient. A simple model for single-phase laminar fluid flow is that the Nusselt number is independent of the flow rate. As an example, consider a series of channels measuring 50 microns (micrometers) wide and 100 microns tall. The hydraulic diameter of this channel is 67 microns. This channel geometry will provide a 1.5 times heat-transfer area as compared to the bare die. And, due to the short channel height, the surface effectiveness is over 99% (this is also called a fin effectiveness; essentially a ratio of how much energy is dissapated from the fin as compared to the maximum that could be dissapated if the entire fin was at the temperature of the base of the fin).

Calculations for a 1 $cm^2$ die with micro-channels and single-phase flow: Single-phase flow through this channel will result in a Nusselt number of between 3.39 and 4.12 for fully developed flow, depending on the surface heating conditions. Considering only the lower case (3.39), the calculated heat-transfer coefficient is then 30,400 $W/m^2$-K.

The area increase (over the die footprint) is 50% due to the vertical surfaces. The thermal impedance of the micro-channels is then calculated as $1/(h*A)=1/(30400*1.5*0.01*0.01)$ $=0.22$ C-$cm^2$/W.

Calculations for a 1 $cm^2$ die with micro-channels and two-phase flow: Boiling heat transfer will greatly increase the effective heat-transfer coefficient. With forced-convection boiling in micro-channels, heat-transfer coefficients between 100,000 and 200,000 $W/m^2$-K have been reported. With the boiling process in the channels, the thermal impedance of the same channel (used for the single-phase case) can be calculated as $1/(100000*1.5*0.01*0.01)=0.07$ C-$cm^2$/W.

The above calculations used only the lower values for either the Nusselt number or flow boiling heat-transfer coefficient. Thermal performance would of course be better with the higher values of these parameters. The potential for low thermal impedance, and therefore low-thermal-resistance packages exist with mini- and/or micro-channel flow.

In an embodiment small channels (either mini- or micro-channels) are used within the silicon and flow a coolant through the channels. In an embodiment, a separate method, still involving the flow of a coolant, is to attach a coldplate, made of (say) copper to either the die or the package (this is called an "integral heat spreader" or IHS).

Some embodiments create the channels and manifolds in a separate wafer of silicon. High-volume processes for creating the channels (etching, sawing, etc.) are, in some embodiments, used on that separate wafer. The cold plate can thus be fabricated, sealed, and tested before an expensive electronics chip is bonded to it.

FIG. 1 is a perspective cut-away schematic view of a chip package 100, used in some embodiments of the invention. Electronics chip 99 (e.g., one having an information processor or computer, communications circuitry, memory, and/or input/output interface functions) is in direct contact with cooling plate 101. Chip 99 includes circuitry 95 (the source of most of the heat to be removed) and connectors 98 (such as solder-ball connectors, pads, or pins) used for power and signals. The cooling channels 114 and manifolds (or plenums) 111 and 112 are created in a separate silicon wafer, which is diced into a plurality of cooling bases 110. In some embodiments, cooling base 110 includes inlet tube 131 attached to cooling base 110 and in fluid communication through opening 133 with inlet manifold 111, and outlet tube 132 attached to cooling base 110 and in fluid communication through opening 134 with outlet manifold 112.

In some embodiments, a plurality of deep parallel grooves (microchannels) 114 are formed between thin walls 113. The microchannels 114 receive fluid from inlet manifold 111 at one of their ends (e.g., their left ends in FIG. 1), and deliver the fluid to outlet manifold 112 at their opposite ends. In some embodiments, inlet manifold 111 and outlet manifold 112 are etched to a greater depth than are microchannels 114. In other embodiments, microchannels 114 are formed by sawing rather than etching. The microchannels 114 are made as deep as it is economical to make them, in order to increase the exposed surface area of walls 113 that act as cooling fins.

Cooling plate 101 includes a cooling base 110 and cover 120, bonded together to seal in the cooling fluid. In some embodiments, the cooling fluid is water. In other embodiments, the cooling fluid is alcohol, an inert fluorinated hydrocarbon, fluoro-chloro-carbon, helium, and/or other suitable cooling fluid (either liquid or gas).

In some embodiments, the cooling plate 101 structure is larger (in width and/or in breadth) than the die 99 to be cooled. This allows more space for the manifolds 111 and 112 without decreasing the thermal performance of the combined package 100. Once the structures have been created, the attachment of the cooling plate 101 to the die 99 can be accomplished through a variety of methods, including, in some embodiments, silicon-silicon bonds (the same technique as is sometimes used for wafer-wafer bonding, which, in some embodiments involves providing a very smooth polished, oxide-free surface on both parts, then squeezing them together and heating them). In other embodiments, high-thermal-conductivity solders, gold bonding, heat-sink paste or epoxy, or other bonding methods are used. In yet other embodiments, the cooling plate 101 and the chip 99 are just clamped together.

The material thickness used for the thermal bond between the die and the cooling structure can be virtually zero (with silicon-silicon bonding) or made very thin due to the two mutually flat, smooth surfaces 94 (the top of chip 99) and 104 (the bottom of cooling plate 101). CTE mismatch between the die 99 and the cooling structure 101 is not a concern, since both are made of the same material (e.g., both are silicon if the chip is silicon, in some embodiments).

The cooling plate 101 of FIGS. 1 and 4 has tubing 131 and 132 (connected to the side of cooling base 110) attached to side 142 for connecting to an external plumbing system that removes the heat from the fluid 89. In other embodiments, openings 133 and 134 are instead threaded with no tubing provided, such that the external plumbing system connects directly to the openings 133 and 134. In yet other embodiments, the inlet and outlet openings are formed in the ends 141, bottom 104, or in cover 520 as shown in FIG. 5, described below.

FIG. 2 is a top schematic view of a cooling-plate base 110. The dotted line in the center of the figure represents where chip 99 is located, in some embodiments. The break line 1 shows the front cut line of FIG. 1. The other elements are described above in the description for FIG. 1.

FIG. 3 is an end schematic view of a cooling-plate base 110. The other elements are described above in the description for FIG. 1.

FIG. 4 is a side schematic view of a chip package 100. The other elements are described above in the description for FIG. 1.

In other embodiments, chip 99 is placed against cover 120 rather than cooling base 110 (e.g., on the top of cooling plate 101 rather than the bottom as shown in FIG. 1). In some embodiments, chip 99 is thinned (e.g., by chemical-mechanical polishing (CMP)) in order to reduce the thermal impedance between the circuit face of the chip and the opposite face. In some embodiments, cover 120 and/or cooling base 110 are thinned (e.g., by CMP) in order to reduce their thermal impedance.

In other embodiments, walls 113 and microchannels 114 are formed on cover 120 in addition to or instead of being formed on substrate base 110, such that the manifolds 111 and 112 are in the substrate base 110, but the microchannels 114 are in cover 120.

FIG. 5 is a perspective cut-away schematic view of a chip package 500, used in some embodiments of the invention. As is the case for FIG. 1, in some embodiments, electronics chip 99 is in direct contact with cooling plate 501 (made of cooling base 510 and cover 520); however, in some embodiments, one or more other chips 97 are also connected so that a single cooling plate 510 cools the plurality of chips 97, 99. Chip 99 and chip 97 include circuitry 95 (the source of most of the heat to be removed) and connectors 98 (such as solder-ball connectors, pads, or pins) used for power and signals. The cooling channels 114 and manifolds (or plennums) 111 and 112 are created in a cooling base 510 as described for FIG. 1; however, for cooling plate 501, the inlet tube 531 and outlet tube 532 are connected to openings in cover 520, yet are still in fluid communication with inlet manifold 111 and outlet manifold 112, respectively. The other elements are described above in the description for FIG. 1.

FIG. 6 is a top schematic view of a cooling-plate base 510. The other elements are described above in the description for FIG. 5.

FIG. 7 is an end schematic view of a cooling-plate base 510. The other elements are described above in the description for FIG. 5.

FIG. 8 is a side schematic view of a chip package 500. The other elements are described above in the description for FIG. 5.

Figure 10:
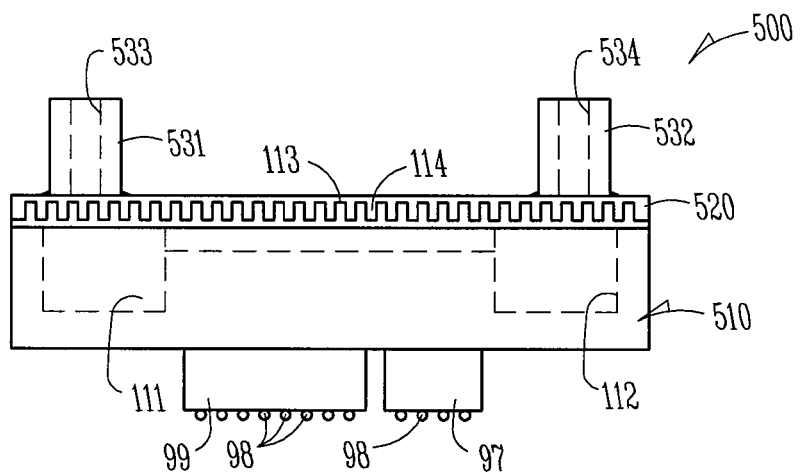
FIG. 10 is a side schematic view of a chip package 500.

FIG. 10 is a side schematic view of a chip package 500. The cover 520 includes walls 113 and microchannels 114. The other elements are described above in the description of FIG. 5.

FIG. 9 is a perspective schematic view of an electronics system 900 of some embodiments (for example, a laptop computer or cell phone or other device) having at least one chip package 920 having a silicon cooling plate. System 900 optionally includes a top portion 910 and a bottom portion 916, a power supply 930 (such as a battery), an antenna 940 (such as for a wireless LAN or cellular communications) a display 911, a memory 921, one or more input/output devices such as a keyboard 912, a diskette 913, and/or a DVD/CDROM 914 or other devices. In some embodiments, electronics package 920 includes a processor and/or telecommunications circuit operatively coupled to the other electronics parts described above. One or more electronics packages 920 (each having a silicon cooling plate) are connected (for example, by tubing 922) to a cold plate (e.g., a sheet of copper or aluminum used to dissipate heat and cool the circulating fluid). The one or more electronics packages 920 can be any of the chip/cooling plate structures described herein, such as, for example, 100 of FIG. 1, or 500 of FIG. 5. Some embodiments further include a pump to assist in moving the fluid through cooling plate 101 (or 501).

In some embodiments, the present invention provides an apparatus 100 or 500 that includes a cooling plate 101 or 501. The cooling plate encloses an inlet plenum 111, an outlet plenum 112, and a plurality of microchannels 114 connecting the inlet plenum 111 to the outlet plenum 112, wherein the cooling plate 101 or 501 is substantially made of silicon.

In some embodiments, the cooling plate 101 or 501 includes a cooling base 110 or 510 having the inlet plenum 111, the outlet plenum 112, and the plurality of microchannels 114 formed therein, and a cover 120 or 520. In some such embodiments the cooling base 110 or 510 is made of polycrystalline silicon. In some embodiments, the cover 120 or 520 is made of polycrystalline silicon. In some embodiments, the microchannels 114 are formed by etching into the cooling base 110 or 510.

Some embodiments further include one or more external fluid connections 131, 132 made at lateral edges of the cooling base.

Some embodiments further include one or more external fluid connections 531, 532 made through the cover.

Some embodiments further include an electronics chip 99 having a first face that includes circuitry 95 formed thereon, and a second face 94 that is attached to the cooling base 110 or 510.

Some embodiments further include an electronics chip 99 having a first face that includes circuitry formed thereon, and a second face that is attached to the cooling plate 101 or 501.

In some embodiments, the chip 99 includes circuitry for at least a portion of a processor, and the apparatus further includes a memory 921 operatively coupled to the processor, an input/output system 911 and/or 912, including a display unit 911, operatively coupled to the processor chip 99, and a power supply 930 operatively coupled to the processor chip 99.

In other embodiments, the chip 99 includes circuitry for at least a portion of a telecommunications circuit, and the apparatus further includes an antenna 940 operatively coupled to the telecommunications circuit, an input/output system, including a display unit 911, operatively coupled to the telecommunications circuit, and a power supply 930 operatively coupled to the telecommunications circuit.

In some embodiments, the invention includes a method for cooling an electronics chip 99 having a substrate with a first face having circuitry 95 thereon, and an opposite second face 94. This method includes providing a cooling plate made of material that matches a coefficient of thermal expansion of the second face of the chip, and that is in thermal contact with the second face of the chip 99, and moving a cooling fluid through the cooling plate 101 or 501.

In some embodiments of the method, the providing of the cooling plate 101 or 501 includes providing a polycrystalline silicon substrate 110 or 510, etching into the substrate an inlet plenum 111, an outlet plenum 112, and a plurality of microchannels connecting the inlet plenum to the outlet plenum, and attaching a cover to the cooling plate.

In some embodiments of the method, the chip is silicon, and wherein the providing of the cooling plate includes providing a polycrystalline silicon substrate, etching into the substrate an inlet plenum, an outlet plenum, and a plurality of microchannels connecting the inlet plenum to the outlet plenum, attaching a cover to the cooling plate, and bonding the silicon chip to the cooling plate.

In some embodiments of the method, the moving of the cooling fluid includes pumping the cooling fluid through external fluid connections 131, 132 at lateral edges of the cooling plate.

In some embodiments, the invention includes an apparatus for cooling an electronics chip having a substrate with a first face having circuitry thereon, and an opposite second face. This apparatus includes means as described herein for containing a cooling fluid moving through microchannels along the second face inside a layer of silicon located adjacent to the second face.

In some embodiments, the means for moving the cooling fluid include an inlet plenum and an outlet plenum in fluid communication with the microchannels, and wherein the microchannels are formed by grooves in a piece of silicon and made separately from the chip.

Some embodiments further include means as described herein for pumping the cooling fluid through external fluid connections at lateral edges of the cooling plate.

In some embodiments, the microchannels include a plurality of parallel high-aspect-ratio grooves etched into a cooling base, wherein the cooling base is covered with a cover.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method for cooling an electronic chip having a substrate with a first face having circuitry thereon, and an opposite second face, the method comprising:
   providing a cooling plate and a cover for the cooling plate, both of which are made of material that matches a coefficient of thermal expansion of the second face of the chip, the cooling plate and the cover for the cooling plate including microchannels therein, the microchannels in the cover for the cooling plate being entirely within the cover for the cooling plate, one or more of the cooling plate and the cover for the cooling plate being in thermal contact with the second face of the chip; and
   moving a cooling fluid through one or more of the cooling plate and the cover for the cooling plate.

2. The method of claim 1, wherein the providing of the cooling plate includes
   providing a polycrystalline silicon substrate;
   etching into the substrate an inlet plenum, an outlet plenum, and the microchannels, the microchannels connecting the inlet plenum to the outlet plenum; and
   attaching the cover for the cooling plate to the cooling plate.

3. The method of claim 1, wherein the chip is silicon, and wherein the providing of the cooling plate includes
   providing a polycrystalline silicon substrate;
   etching into the substrate an inlet plenum, an outlet plenum, and the microchannels, the microchannels connecting the inlet plenum to the outlet plenum;
   attaching the cover for the cooling plate to the cooling plate; and
   bonding the silicon chip to the cooling plate.

4. The method of claim 1, wherein the moving of the cooling fluid includes pumping the cooling fluid through external fluid connections at lateral edges of the cooling plate.

* * * * *